(12) United States Patent
Ji

(10) Patent No.: US 12,355,906 B2
(45) Date of Patent: Jul. 8, 2025

(54) ELECTRONIC DEVICE

(71) Applicant: VIVO MOBILE COMMUNICATION CO., LTD., Dongguan (CN)

(72) Inventor: Guisheng Ji, Dongguan (CN)

(73) Assignee: VIVO MOBILE COMMUNICATION CO., LTD., Dongguan (CN)

( * ) Notice: Subject to any disclaimer, the term of this patent is extended or adjusted under 35 U.S.C. 154(b) by 233 days.

(21) Appl. No.: 17/954,312

(22) Filed: Sep. 27, 2022

(65) Prior Publication Data

US 2023/0017831 A1  Jan. 19, 2023

Related U.S. Application Data

(63) Continuation of application No. PCT/CN2021/083908, filed on Mar. 30, 2021.

(30) Foreign Application Priority Data

Mar. 30, 2020  (CN) .......................... 202010238576.7

(51) Int. Cl.
   *H04M 1/02*  (2006.01)
   *H05K 5/02*  (2006.01)

(52) U.S. Cl.
   CPC ....... *H04M 1/0264* (2013.01); *H04M 1/0266* (2013.01); *H05K 5/0247* (2013.01)

(58) Field of Classification Search
   CPC .... H05K 5/0017; H05K 5/0247; H05K 9/002; H05K 9/0075; H04N 23/51; H04M 1/0266; H04M 1/0264
   See application file for complete search history.

(56) References Cited

U.S. PATENT DOCUMENTS

| 10,277,786 B1 | 4/2019 | Leonelli, Jr. |
| 2010/0210074 A1 | 8/2010 | Kim et al. |

(Continued)

FOREIGN PATENT DOCUMENTS

| CN | 204795931 U | 11/2015 |
| CN | 206686225 U | 11/2017 |

(Continued)

OTHER PUBLICATIONS

International Search Report issued in corresponding International Application No. PCT/CN2021/083908, mailed May 26, 2021, 5 pages.

(Continued)

*Primary Examiner* — Xi Wang
(74) *Attorney, Agent, or Firm* — IPX PLLC

(57) ABSTRACT

An electronic device is provided. The electronic device includes a front housing with a first through hole, a rear housing connected to the front housing, a display installed on the front housing, a reinforcing member, and a camera. A mounting chamber is formed between the display, the front housing, and the rear housing. The reinforcing member is arranged in the mounting chamber, spaced apart from the display, connected to the rear housing, and provided with a second through hole. The camera is installed in the mounting chamber and the first through hole, located between the display and the reinforcing member. The camera includes a bracket, a chip, and a body connected successively. The bracket is connected to the front housing and the rear housing respectively. The chip is arranged corresponding to the second through hole.

8 Claims, 3 Drawing Sheets

(56) References Cited

U.S. PATENT DOCUMENTS

| | | | |
|---|---|---|---|
| 2012/0014688 A1 | 1/2012 | Ma | |
| 2017/0085764 A1 | 3/2017 | Kim et al. | |
| 2017/0201010 A1* | 7/2017 | Kim | H01Q 1/243 |
| 2019/0261540 A1* | 8/2019 | Lee | H04M 1/0277 |

FOREIGN PATENT DOCUMENTS

| | | |
|---|---|---|
| CN | 107888729 A | 4/2018 |
| CN | 108957819 A | 12/2018 |
| CN | 208386733 A | 1/2019 |
| CN | 209233925 U | 8/2019 |
| CN | 110460697 A | 11/2019 |
| CN | 210075377 U | 2/2020 |
| CN | 111405791 A | 7/2020 |
| EP | 3522504 A1 | 8/2019 |
| JP | 2003230028 A | 8/2003 |
| JP | 2019513318 A | 5/2019 |
| WO | 2019147012 A1 | 8/2019 |

OTHER PUBLICATIONS

First Office Action issued in related Chinese Application No. 202010238576.7, mailed Dec. 3, 2020, 6 pages.
Extended European Search Report issued in related European Application No. 21778744.9, mailed Aug. 31, 2023, 10 pages.

* cited by examiner

ELECTRONIC DEVICE

CROSS-REFERENCE TO RELATED APPLICATIONS

This application is a continuation of International Application No. PCT/CN2021/083908, filed Mar. 30, 2021, which claims priority to Chinese Patent Application No. 202010238576.7, filed Mar. 30, 2020. The entire contents of each of the above-referenced applications are expressly incorporated herein by reference.

TECHNICAL FIELD

The present disclosure relates to the field of communication devices and technologies, and in particular, to an electronic device.

BACKGROUND

With higher requirements on the functions and appearance of electronic devices, electronic devices are developing toward higher screen-to-body ratios and better shooting experience. Accordingly, electronic devices with a periscope camera have been developed.

However, for electronic devices with a periscope camera in the related art, the periscope camera is of a large volume and occupies a large space in the electronic device. In order to ensure the reliability of the electronic device, a buffer space needs to be reserved, which results in a large thickness of the electronic device. In addition, in order to meet the installation requirements, an installation gap also needs to be reserved in the thickness direction. Consequently, the thickness of the electronic device cannot be further reduced.

SUMMARY

The present disclosure discloses an electronic device.

An electronic device includes a front housing, a rear housing, a display, a reinforcing member, and a camera. The front housing is provided with a first through hole. The rear housing is connected to the front housing. The display is installed on the front housing. A mounting chamber is formed between the display, the front housing, and the rear housing. The reinforcing member is arranged in the mounting chamber. The reinforcing member is spaced apart from the display. The reinforcing member is connected to the rear housing. The reinforcing member is provided with a second through hole. The camera is installed in the mounting chamber. The camera is located between the display and the reinforcing member. The camera is installed in the first through hole. The camera includes a bracket, a chip, and a body connected successively. The bracket is connected to the front housing and the rear housing respectively. The chip is arranged corresponding to the second through hole.

The technical solutions adopted by the present disclosure can achieve the following beneficial effects:

In the electronic device disclosed in embodiments of the present disclosure, the first through hole is provided on the front housing, the camera is installed in the first through hole, the second through hole is provided on the reinforcing member, and the chip of the camera is arranged corresponding to the second through hole, so that the size of the electronic device in the thickness direction can be reduced, making the electronic device thinner.

BRIEF DESCRIPTION OF THE DRAWINGS

The accompanying drawings described herein are used to provide a further understanding of the present disclosure and construct a part of the present disclosure. Exemplary embodiments of the present disclosure and descriptions thereof are used to explain the present disclosure, and do not constitute an improper limitation to the present disclosure.

LIST OF REFERENCE NUMERALS

100—Electronic device; 1—Front housing; 2—Rear housing; 3—Display; 4—Reinforcing member; 5—Camera; 51—Body; 52—Chip; 53—Bracket; 6—Back cover; 7—First buffer member; 8—Second buffer member; 001—First through hole; 002—Second through hole; 003—Third through hole.

DETAILED DESCRIPTION

To clearly state the objectives, technical solutions, and advantages of the present disclosure, the technical solutions of the present disclosure will be described below with reference to specific embodiments of the present disclosure and the accompanying drawings. Apparently, the described embodiments are some embodiments rather than all the embodiments of the present disclosure. All other embodiments obtained by a person of ordinary skill in the art based on the embodiments of the present disclosure without creative efforts shall fall within the protection scope of the present disclosure.

Figure 1:
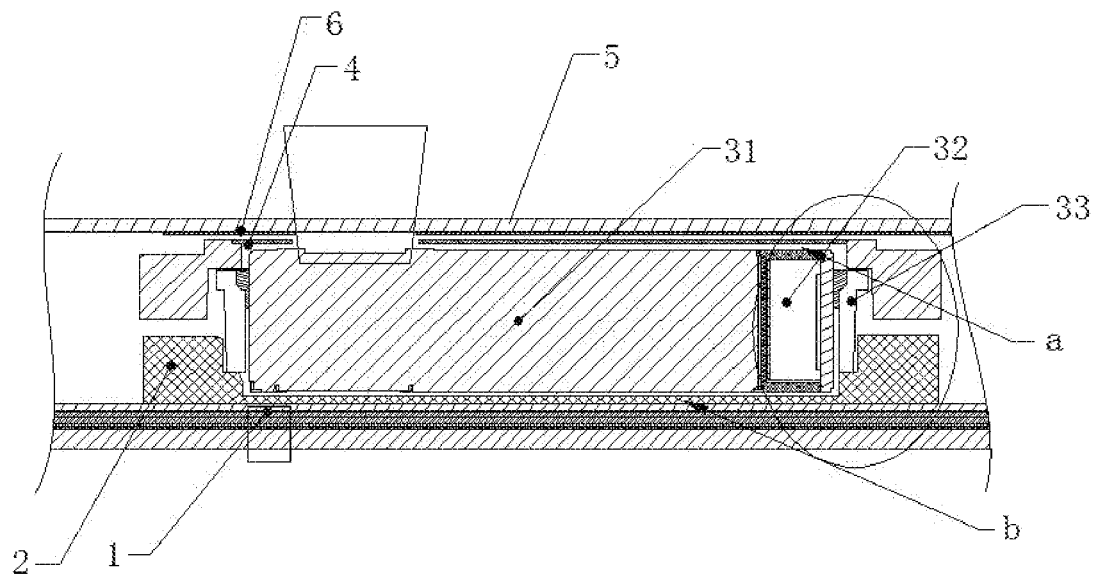
FIG. 1 is a schematic partial cross-sectional view of an electronic device in the related art.
Figure 2:
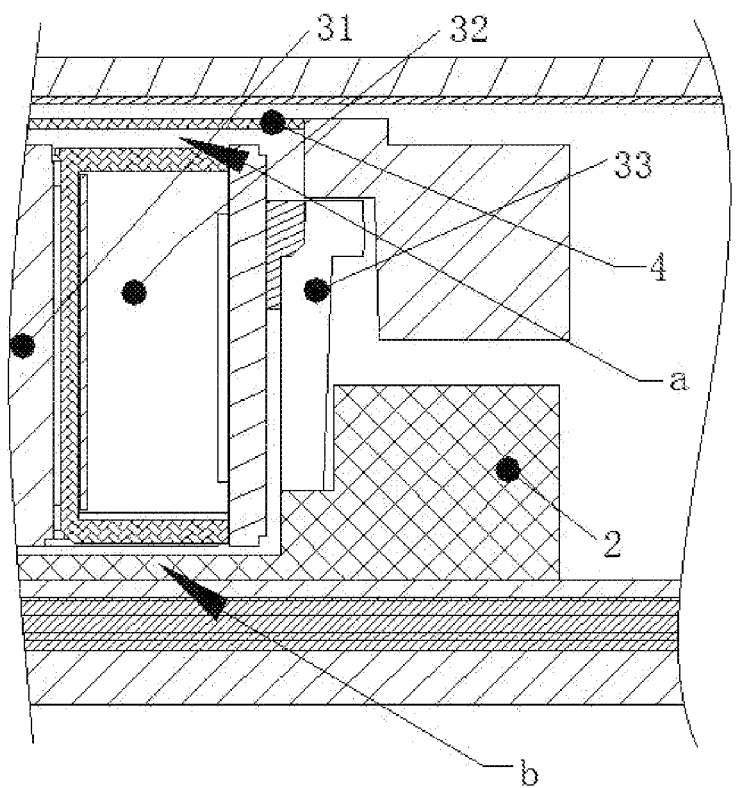
FIG. 2 is an enlarged view of a circled part in FIG. 1.

The following first describes an electronic device with a periscope camera in the related art with reference to FIG. 1 and FIG. 2.

As shown in FIG. 1, in the electronic device with the periscope camera, a display 1 is installed on a front housing 2, a rear housing 5 is connected to the front housing 2, and the periscope camera is installed in a mounting chamber jointly defined by the front housing 2 and the rear housing 5. The periscope camera includes a body (including a lens and a motor) 31, a chip 32, a camera bracket 33. A reinforcing member 4 is arranged on the rear housing 5 at a position corresponding to the periscope camera. A buffer member 6 is arranged on an inner wall of the rear housing 5.

In the related art, in order to prevent the periscope camera and the display 1 from impacting each other when the electronic device is under an external force and to reduce the probability of cracking of the display, the front housing 2 is provided with a wall thickness b at a bottom part of the periscope camera. The wall thickness b is generally 0.35 mm.

As shown in FIG. 2, the reinforcing member 4 covers above the periscope camera, and has a function of protecting the periscope camera from impact. However, because an assembly tolerance exists between the chip 32 and the body 31 of the periscope camera, and the assembly tolerance is approximately ±0.2, a gap a is provided between the reinforcing member 4 and the periscope camera in order to avoid assembly interference. The gap a generally needs to be 0.25 mm.

It is found that because the wall thickness b and the gap a accumulate in a thickness direction of the electronic device, the periscope camera becomes a bottleneck in reducing the thickness of the entire device. As a result, the thickness of the electronic device is large and cannot be further reduced.

It can be seen that electronic devices with the periscope camera in the related art have the problem of large thickness.

In order to solve the problem in the related art to a certain extent, the inventor has paid a lot of creative labor and put forward the technical solutions of the present disclosure. The technical solutions disclosed in the embodiments of the present disclosure will be described in detail below with reference to FIG. 3 and FIG. 4.

Figure 3:
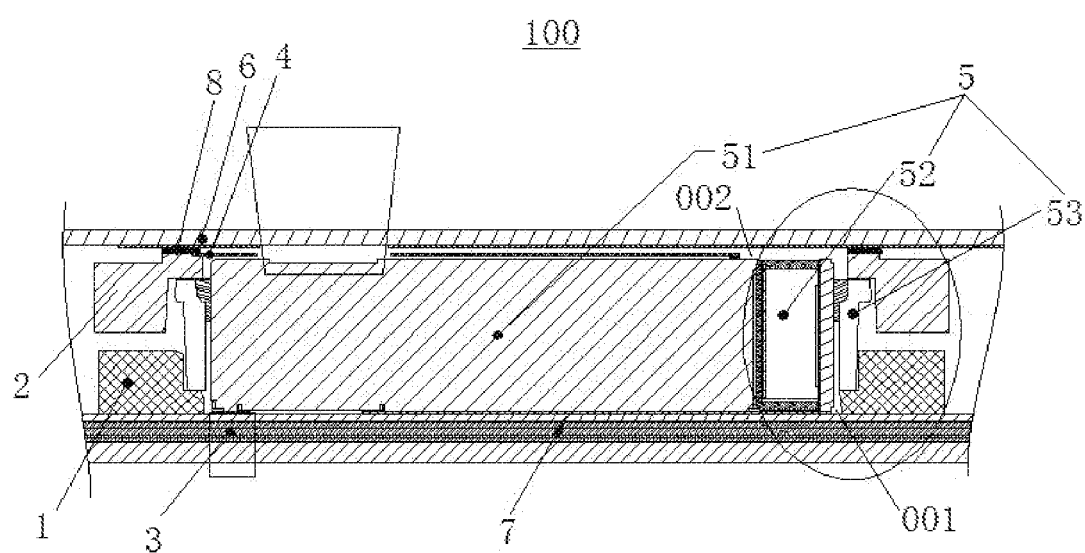
FIG. 3 is a schematic partial cross-sectional view of an electronic device according to an embodiment of the present disclosure.
Figure 4:
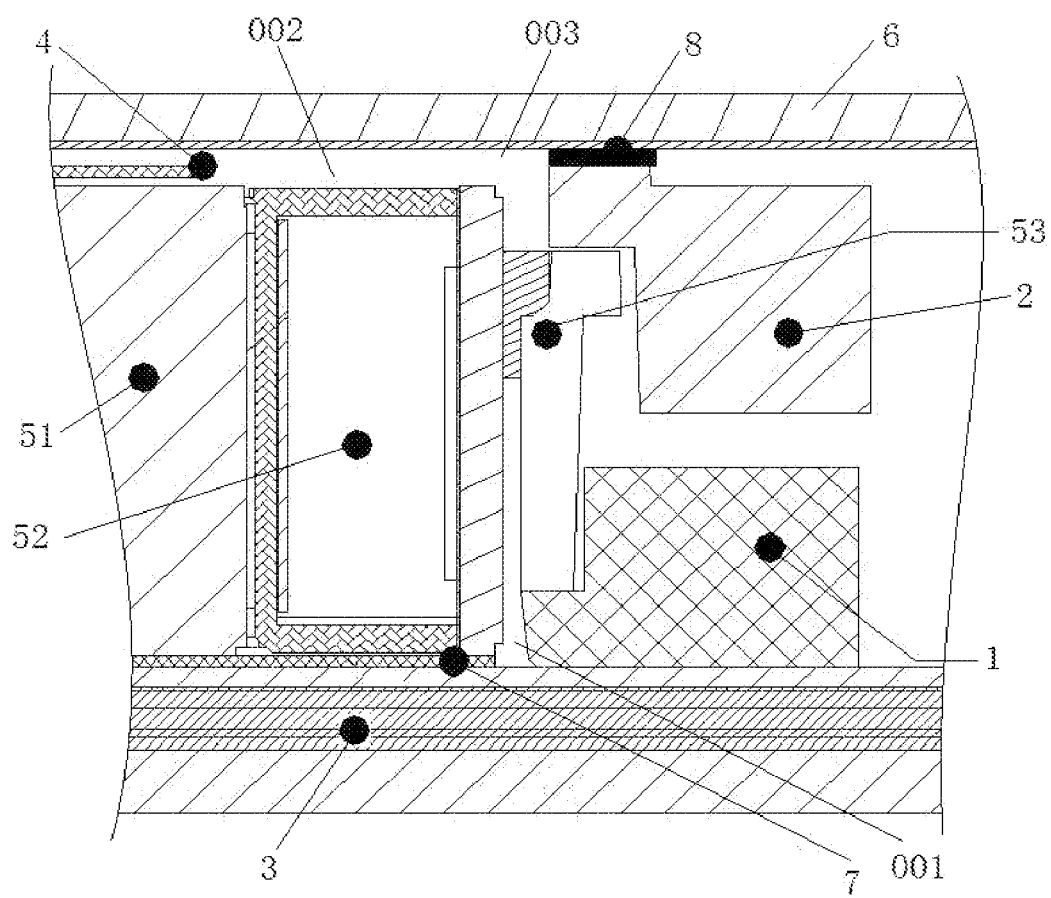
FIG. 4 is an enlarged view of a circled part in FIG. 3.

As shown in FIG. 3 and FIG. 4, an electronic device 100 according to an embodiment of the present disclosure includes a front housing 1, a rear housing 2, a display 3, a reinforcing member 4, and a camera 5. The front housing 1 is provided with a first through hole 001. The rear housing 2 is connected to the front housing 1. The display 3 is installed on the front housing. A mounting chamber is formed between the display 3, the front housing 1, and the rear housing 2. The reinforcing member 4 is arranged in the mounting chamber. The reinforcing member 4 is spaced apart from the display 3. The reinforcing member 4 is connected to the rear housing 2. The reinforcing member 4 is provided with a second through hole 002. The camera 5 is installed in the mounting chamber. The camera 5 is located between the display 3 and the reinforcing member 4. The camera 5 is installed in the first through hole 001. The camera 5 includes a bracket 53, a chip 52, and a body 51 connected successively. The bracket 53 is connected to the front housing 1 and the rear housing 2 respectively. The chip 52 is arranged corresponding to the second through hole 002.

On the one hand, because the front housing 1 is provided with the first through hole 001, and the camera 5 is installed in the first through hole 001, the wall thickness b of the front housing 1 at this position in the related art can be reduced, and the wall thickness may even be reduced to zero, so that the thickness of the electronic device 100 can be reduced by 0.3 mm approximately. On the other hand, because the reinforcing member 4 is provided with the second through hole 002, and the chip 52 of the camera 5 is arranged corresponding to the second through hole 002, the second through hole 002 can be used to reserve the installation gap for the chip 52 to avoid interference, thereby reducing the gap a between the camera 5 and the reinforcing member 4 in the related art. In this way, not only the reliability of the electronic device 100 can be ensured, but also the bottleneck in reducing the thickness can be overcome, and the size of electronic device 100 in the thickness direction is reduced, making the electronic device 100 thinner.

In short, in the electronic device 100 according to the embodiments of the present disclosure, because the first through hole 001 is provided on the front housing 1 (that is, a portion of the front housing 1 corresponding to the camera 5 is hollowed), the camera 5 is installed in the first through hole 001, the second through hole 002 is provided on the reinforcing member 4, and the chip 52 of the camera 5 is arranged corresponding to the second through hole 002, the size of the electronic device 100 in the thickness direction can be reduced, making the electronic device 100 thinner.

According to some embodiments of the present disclosure, a peripheral surface of the camera 5 matches with an inner wall surface of the first through hole 001, and a front surface of the camera 5 abuts against the display 3. Therefore, the wall thickness b of the front housing 1 of the camera 5 in the related art can be reduced to zero.

According to some other embodiments of the present disclosure, a first buffer member 7 is arranged in the first through hole 001, and the first buffer member 7 is connected to the front surface of the camera 5 and the display 3. In other words, the first buffer member 7 may be arranged between the camera 5 and the display 3, to protect the display 3 when the electronic device 100 is under an external force, thereby reducing the probability of cracking of the display 3 and improving the reliability.

In some embodiments, a thickness n of the first buffer member 7 satisfies: n≤0.25 mm. That is, a gap of no more than 0.25 mm is reserved between the front surface of the camera 5 and the display 3 for installing a buffer member. For example, the thickness of the first buffer member 7 may be 0.1 mm, 0.2 mm, etc. Certainly, the thickness of the first buffer member 7 may also have other values, and may be set as required according to the reliability of the display 3, which is not particularly limited in the present disclosure. It can be understood that, compared with the arrangement in the related art shown in FIG. 1 and FIG. 2. the arrangement of the first buffer member 7 in the embodiments of the present disclosure can still satisfy the requirement of reducing the thickness of the electronic device 100.

According to some embodiments of the present disclosure, an area of the second through hole 002 is larger than an area of an orthographic projection of the chip 52 on the reinforcing member 4. In other words, the chip 52 of the camera 5 can be completely accommodated in the position corresponding to the second through hole 002. In this way, the second through hole 002 can completely accommodate the assembly tolerance between the chip 52 of the camera 5 and the body 51, and the second through hole 002 can also be used to reserve a gap for the chip 52 to prevent interference, so that the gap a in the related art can be reduced, or even the gap a can be eliminated to further reduce the thickness of the electronic device 100.

As shown in FIG. 3 and FIG. 4, the electronic device 100 further includes: a back cover 6. The back cover 6 is connected to the rear housing 2. The mounting chamber is closed by the back cover 6. The reinforcing member 4 is connected between the back cover 6 and the rear housing 2. As an external component of the electronic device 100, the back cover 6 can provide protection for the camera 5 and other components. The reinforcing member 4 can cooperate with the back cover 6 to improve the stability and reliability of the camera 5.

According to some embodiments of the present disclosure, the chip 52 is spaced apart from the back cover 6. It can be understood that, the arrangement of the second through hole 002 can space the chip 52 apart from the back cover 6 to prevent the chip 52 from directly abutting against the back cover 6, and prevent the chip 52 from being squeezed when the back cover 6 is under an external force, thereby further improving the reliability.

In some embodiments, a distance m between the chip 52 and an inner surface of the back cover 6 satisfies: 0.08 mm≤m≤0.12 mm. In other words, a distance of 0.08 mm to 0.12 mm, for example, 0.08 mm, 0.1 mm, or 0.11 mm, is provided between the chip 52 of the camera 5 and the back cover 6. On the one hand, the distance can prevent the chip 52 and the back cover 6 from interfering with each other, thereby facilitating assembly. On the other hand, the existence of the distance can also buffer certain pressure to reduce the probability of damage to the chip 52.

In some embodiments, as shown in FIG. 3 and FIG. 4, a second buffer member 8 is arranged between the back cover 6 and the rear housing 2, the second buffer member 8 is connected to an inner surface of the back cover 6 and a rear surface of the rear housing 2, and the second buffer member 8 is provided with a third through hole 003 for avoiding the camera 5. In this way, the back cover 6 and the rear housing 2 can be elastically connected by the second buffer member 8, and the arrangement of the first through hole 003 allows for receiving the camera 5 therein, to prevent the accumulation of the second buffer member 8 and the camera 5 in the thickness direction, which can improve the reliability while helping reduce the thickness, achieving a more compact and reasonable structural layout in the electronic device 100.

In some embodiments, the first buffer member 7 may be a foam or silica gel, and correspondingly, the second buffer member 8 may also be a foam or silica gel. The first buffer member 7 and the second buffer member 8 can provide a buffer effect for the camera 5 through elastic deformation and improve the reliability of the camera 5 and the display 3 under an external force or impact, and are easy to assemble and cost-effective.

According to some embodiments of the present disclosure, the reinforcing member 4 is a steel sheet, and a rear surface of the camera 5 is connected to the reinforcing member 4. In this way, the reinforcing member 4 can provide certain protection for the camera 5, thereby improving the stability and reliability of the electronic device.

In conclusion, the electronic device 100 according to the embodiments of the present disclosure can effectively reduce the size of the electronic device 100 in the thickness direction, making the electronic device 100 thinner.

In the above embodiments of the present disclosure, the differences between the embodiments are mainly described. Different optimization features between the embodiments be combined to form better embodiments as long as no conflict is caused. For brevity, such combinations will not be described in detail herein.

The embodiments of the present disclosure have been described above with reference to the accompanying drawings. The present disclosure is not limited to the specific embodiments described above, and the specific embodiments described above are merely exemplary and not limitative. Those of ordinary skill in the art may make various variations under the teaching of the present disclosure without departing from the spirit of the present disclosure and the protection scope of the claims, and such variations shall all fall within the protection scope of the present disclosure.

What is claimed is:

1. An electronic device, comprising:
a front housing provided with a first through hole;
a rear housing connected to the front housing;
a display installed on the front housing;
a mounting chamber formed between the display, the front housing, and the rear housing;
a reinforcing member arranged in the mounting chamber, spaced apart from the display, connected to the rear housing, and provided with a second through hole; and
a camera installed in the mounting chamber and the first through hole and located between the display and the reinforcing member,
wherein the camera comprises a bracket, a chip, and a body connected successively, wherein the bracket is connected to the front housing and the rear housing, respectively, and the chip is arranged corresponding to the second through hole,
wherein the electronic device further comprises a back cover, wherein the back cover is connected to the rear housing, the mounting chamber is closed by the back cover, and the reinforcing member is connected between the back cover and the rear housing, and
wherein a buffer member is:
arranged between the back cover and the rear housing;
connected to an inner surface of the back cover and a rear surface of the rear housing; and
provided with a third through hole for avoiding the camera.

2. The electronic device according to claim 1, wherein a peripheral surface of the camera matches with an inner wall surface of the first through hole, and a front surface of the camera abuts against the display.

3. The electronic device according to claim 1, wherein-a-first another buffer member is arranged in the first through hole, and the first buffer member is connected to a front surface of the camera and the display.

4. The electronic device according to claim 3, wherein a thickness n of the other buffer member satisfies: $n \leq 0.25$ mm.

5. The electronic device according to claim 1, wherein an area of the second through hole is larger than an area of an orthographic projection of the chip on the reinforcing member.

6. The electronic device according to claim 1, wherein the chip is spaced apart from the back cover.

7. The electronic device according to claim 1, wherein a distance m between the chip and an inner surface of the back cover satisfies: $0.08 \text{ mm} \leq m \leq 0.12$ mm.

8. The electronic device according to claim 1, wherein the reinforcing member is a steel sheet, and a rear surface of the camera is connected to the reinforcing member.

* * * * *